United States Patent
Choi et al.

(10) Patent No.: US 9,431,432 B2
(45) Date of Patent: Aug. 30, 2016

(54) ARRAY SUBSTRATE, METHOD FOR MANUFACTURING THE SAME, DISPLAY DEVICE

(71) Applicant: BOE Technology Group Co., Ltd., Beijing (CN)

(72) Inventors: Hyun Sic Choi, Beijing (CN); Hee Cheol Kim, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 51 days.

(21) Appl. No.: 14/418,161

(22) PCT Filed: Apr. 30, 2014

(86) PCT No.: PCT/CN2014/076608
§ 371 (c)(1),
(2) Date: Jan. 29, 2015

(87) PCT Pub. No.: WO2015/096340
PCT Pub. Date: Jul. 2, 2015

(65) Prior Publication Data
US 2016/0005766 A1    Jan. 7, 2016

(30) Foreign Application Priority Data
Dec. 23, 2013 (CN) .......................... 2013 1 0717853

(51) Int. Cl.
*H01L 27/12* (2006.01)
*H01L 21/56* (2006.01)
(Continued)

(52) U.S. Cl.
CPC .............. *H01L 27/124* (2013.01); *H01L 21/56* (2013.01); *H01L 21/76877* (2013.01);
(Continued)

(58) Field of Classification Search
CPC ............. H01L 27/124; H01L 27/1256; H01L 23/5384; H01L 23/5381; H01L 23/5386; H01L 21/76897; H01L 21/56; H01L 21/76877; H01L 2924/0002
See application file for complete search history.

(56) References Cited

U.S. PATENT DOCUMENTS 5,691,787 A * 11/1997 Shimada ............... H01L 29/458
257/59
5,994,155 A    11/1999 Kim
(Continued)

FOREIGN PATENT DOCUMENTS

CN         1637529 A      7/2005
CN       101847641 A      9/2010
(Continued)

OTHER PUBLICATIONS

International Search Report and Written Opinion (in Chinese only) for PCT Application No. PCT/CN2014/076608, dated Sep. 30, 2014, 10 pages.
(Continued)

*Primary Examiner* — Anne Hines
*Assistant Examiner* — Jose M Diaz
(74) *Attorney, Agent, or Firm* — Westman, Champlin & Koehler, P.A.

(57) ABSTRACT

The embodiments of the present invention disclose an array substrate, a method for manufacturing the same, and a display device. With the solutions of the embodiments, aperture rate is increased, and gate signal delay caused by increased connection resistance of gate line is alleviated. The array substrate of the present invention includes a thin film transistor; a substrate; a common electrode provided on the substrate; a gate line comprising a plurality of separate segments arranged to be spaced apart from each other and connected with each other through a bridge; and a common electrode line provided to be spaced apart from the gate line, the gate line and the common electrode line being in the same layer, wherein the common electrode line comprises a connection segment extending through a gap between separate segments to electrically connect with the common electrode directly.

20 Claims, 4 Drawing Sheets

(51) Int. Cl.
  *H01L 21/768* (2006.01)
  *H01L 23/538* (2006.01)

(52) U.S. Cl.
  CPC .... *H01L 21/76897* (2013.01); *H01L 23/5381* (2013.01); *H01L 23/5384* (2013.01); *H01L 23/5386* (2013.01); *H01L 27/1259* (2013.01); *H01L 2924/0002* (2013.01)

(56) References Cited

U.S. PATENT DOCUMENTS

| | | | |
|---|---|---|---|
| 6,256,077 B1* | 7/2001 | Baek | G02F 1/13458 257/59 |
| 2005/0094079 A1 | 5/2005 | Yoo et al. | |
| 2009/0167975 A1* | 7/2009 | Lee | G02F 1/13458 349/43 |
| 2012/0007091 A1* | 1/2012 | Lee | G02F 1/136286 257/60 |
| 2016/0104722 A1* | 4/2016 | Woo | H01L 27/124 257/72 |

FOREIGN PATENT DOCUMENTS

| | | |
|---|---|---|
| CN | 102629577 A | 8/2012 |
| CN | 103257769 A | 8/2013 |
| CN | 103715202 A | 4/2014 |

OTHER PUBLICATIONS

First Office Action for Chinese Patent Application No. 201310717853.2, dated Sep. 25, 2014, 6 pages.

* cited by examiner

Fig.1

(Prior Art)

Fig.7

ARRAY SUBSTRATE, METHOD FOR MANUFACTURING THE SAME, DISPLAY DEVICE

CROSS-REFERENCE TO RELATED APPLICATION

This application is a Section 371 National Stage application of International Application No. PCT/CN2014/076608, filed 30 Apr. 2014, which has not yet published, which claims priority to Chinese Patent Application No. 201310717853.2, filed 23 Dec. 2013, in Chinese, the contents of which are hereby incorporated by reference in their entirety.

BACKGROUND OF THE INVENTION

1. Field of the Invention

The embodiments of the present invention relate to a technical field of display, more particularly, relate to an array substrate, a method for manufacturing the same, and a display device.

2. Description of the Related Art

In Advanced-Super Dimensional Switching (ADS) technology, a multi-dimensional electric field is formed by a parallel electric field and a longitudinal electric field, the parallel electric field is produced by coplanar edges of pixel electrodes or coplanar edges of a common electrode, and the longitudinal electric field is produced between the pixel electrodes and the common electrode. With the multi-dimensional electric field, all alignment liquid crystal molecules within the liquid crystal cell between the pixel electrodes and the common electrode, as well as above the pixel electrodes or the common electrode, are rotated and switched, and therefore, working efficiency of plane-orientation liquid crystals is improved, and the light transmittance is increased.

The ADS technology may improve image quality of TFT-LCD, and has the advantages of high transmission rate, wide view angle, high aperture rate, low aberration, faster response time, no push Mura and the like.

Figure 1:
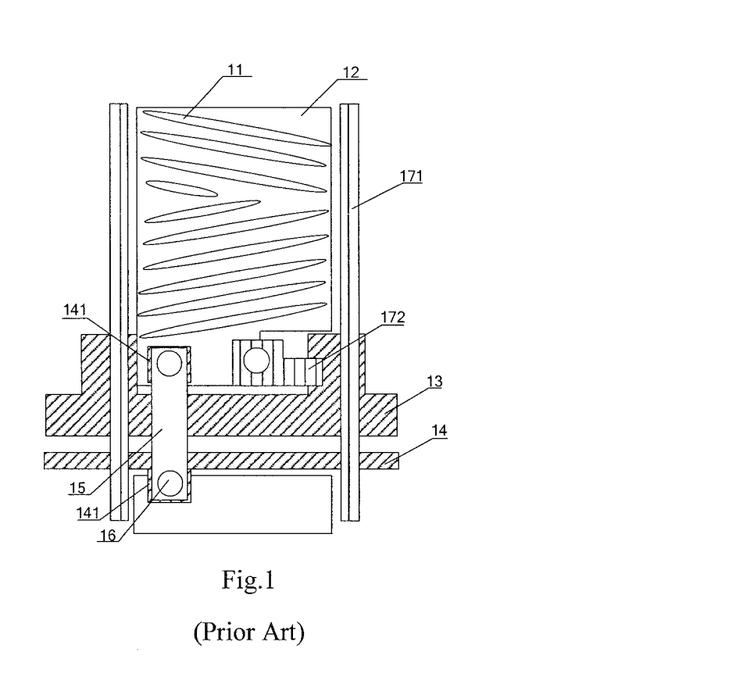
FIG. 1 is a schematic view showing the structure of an ADS array substrate known by the inventor.

An ADS display device is formed by ceiling a color filter substrate and an ADS array substrate. As shown in FIG. 1, the ADS array substrate comprises a substrate; and a thin film transistor, a pixel electrode 11 and a common electrode 12 which are provided on the substrate. The pixel electrode 11 is an upper strip electrode, and the common electrode 12 is a lower plate electrode. During manufacturing, a source-drain metal layer forms source/drain electrodes 172 of the thin film transistor, and a data line 171; a gate metal layer forms a gate line 13 (a portion of the gate line 13 is used as a gate electrode of the thin film transistor), a common electrode line 14, and gate pads 141; and then a connection line 15 is formed in a second transparent conductive layer (for example, $2^{nd}$ ITO layer, for forming the pixel electrodes 11). The connection line 15 connects the common electrode line 14 with the common electrode 12 through via holes 16 in the gate pads 141.

If the common electrode line 14 and the gate line 13 are not provided in the same layer, manufacturing processes increases; however, if they are provided in the same layer, the aperture rate is reduced by the common electrode line 14 and the gate pads 141, and connection resistance of the gate line is increased by the via holes for connecting the common electrode line 14 with the common electrode 12.

SUMMARY OF THE INVENTION

Embodiments of the present invention provide an array substrate comprising: a thin film transistor; a substrate; a common electrode provided on the substrate; a gate line comprising a plurality of separate segments which are arranged to be spaced apart from each other and are connected with each other through a bridge; and a common electrode line provided to be spaced apart from the gate line, the gate line and the common electrode line being in the same layer, wherein the common electrode line comprises a connection segment extending through a gap between separate segments to electrically connect with the common electrode directly.

Embodiments of the present invention also provide a display device comprising any one of the above array substrates.

Embodiments of the present invention still provide a method for manufacturing an array substrate, comprising steps of: S1: manufacturing a gate metal layer, comprising forming a gate electrode, a gate line and a common electrode line, the formed gate line comprising a plurality of separate segments which are arranged to be spaced apart from each other, the formed common electrode line having a connection segment extending through a gap between the separate segments to a predetermined position; S2: manufacturing a thin film transistor, comprising forming a gate insulation layer, a semi-conductive layer, source and drain electrodes, and a data line; S3: forming a common electrode which is electrically connected with the common electrode line via the connection segment extending through the gap; S4: forming a passivation protection layer; S5: forming pixel electrodes, wherein the method further comprises forming a bridge, two ends of the bridge are electrically connected with two adjacent separate segments respectively.

Embodiments of the present invention further provide a method for manufacturing an array substrate, comprising steps of: forming a plurality of separate segments which are components of a gate line, the plurality of separate segments are spaced apart from each other; forming a common electrode line having a connection segment extending through a gap between the separate segments to a predetermined position; forming a bridge, two ends of the bridge are electrically connected with two adjacent separate segments respectively; and forming a common electrode which is electrically connected with the common electrode line by the connection segment extending through the gap.

BRIEF DESCRIPTION OF THE DRAWINGS

In order to more clearly describe embodiments of the present invention, hereafter, drawings therefor will be introduced simply. Obviously, these drawings herein are intended to illustrate some embodiments of the present invention, and many modifications may be made to these drawings by those skilled in this art with no inventive work.

LIST OF REFERENCE NUMBERS

11—pixel electrode, 12—common electrode, 13—gate line, 14—common electrode line, 141—gate pad;

15—connection line, 16—via hole, 171—data line, 172—source/drain electrode, 152—bridge;

131—gate electrode of thin film transistor, 130—separate segment, 142—bending segment, 153—parallel-connection line.

DETAILED DESCRIPTION OF PREFERRED EMBODIMENTS OF THE INVENTION

The solutions of the embodiments of the present invention will be described clearly and completely with reference to the attached drawings of the embodiments of the present invention.

The embodiments of the present invention provide an array substrate. As shown in FIGS. 2-6, the array substrate comprises a thin film transistor; a substrate; a common electrode 12 provided on the substrate; a gate line comprising a plurality of separate segments 130 which are arranged to be spaced apart from each other and are connected with each other through a bridge 152; and a common electrode line 14 provided to be spaced apart from the gate line, the gate line and the common electrode line 14 being in the same layer, wherein the common electrode line 14 comprises a connection segment 144 extending through a gap between the separate segments 130 to electrically connect with the common electrode 12 directly.

The embodiments of the present invention provide an array substrate for a plane-field display device, the array substrate being provided with a pixel electrode and a common electrode, and a thin film transistor for controlling application of display signals. As for a film structure, the array substrate generally comprises a substrate, a gate metal layer (for forming a gate line and a gate electrode of the thin film transistor), a gate insulation layer, a semi-conductive layer, a source-drain metal layer (for forming a data line and source and drain electrodes of the thin film transistor), an interlayer insulation layer, a first transparent conductive layer, a passivation protection layer, and a second transparent conductive layer, wherein all the above layers are provided onto the substrate, and the first and second transparent conductive layers are used to form the pixel electrode and the common electrode respectively.

Figure 2:
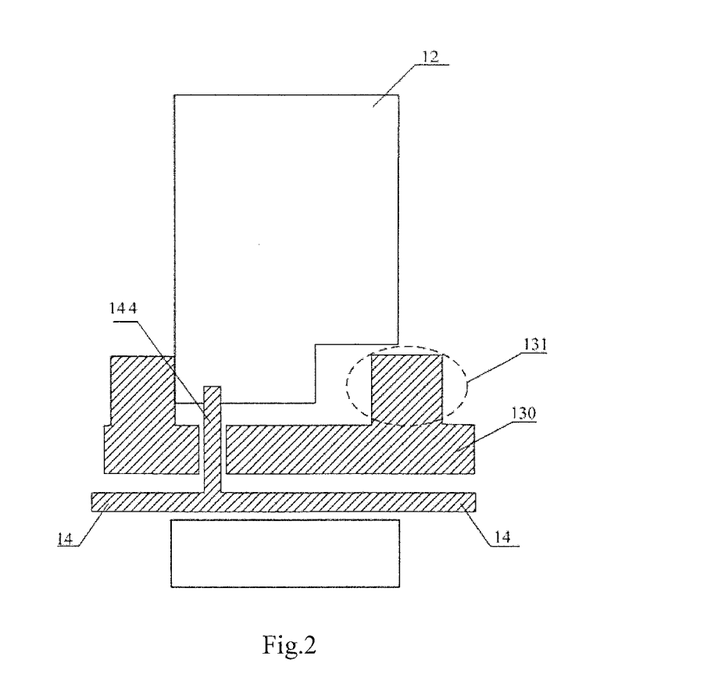
FIG. 2 is a schematic view showing the structure of a gate metal layer of an array substrate according to an embodiment of the present invention.

For the purpose of understanding, FIG. 2 only shows the common electrode 12 and the gate metal layer, the gate metal layer according to the embodiment of the present invention comprises a gate line and a common electrode line 14, wherein the gate line comprises a plurality of separate segments 130 which are spaced apart from each other and which are connected with each other by means of a bridge (not shown in FIG. 2, referring to the reference number 152 in FIGS. 4-6); the connection segment 144 of the common electrode line 14 extends through a discontinued portion of the gate line (or a gap between the separate segments 130) to electrically connect with the common electrode 12 directly. Herein, the separate segment 130 may comprise the gate electrode 131 of the thin film transistor.

It should be noted that in the embodiment of the present invention, the gap between two adjacent separate segments 130 may be located below the bridge.

Compared to the prior art mentioned in the Background, the gate pad and the via holes for connecting the common electrode line and the common electrode are omitted, therefore, the aperture rate is increased, the connection resistance of the gate line is reduced, and gate signal delay of the gate line caused by increased connection resistance is alleviated.

Figure 3:
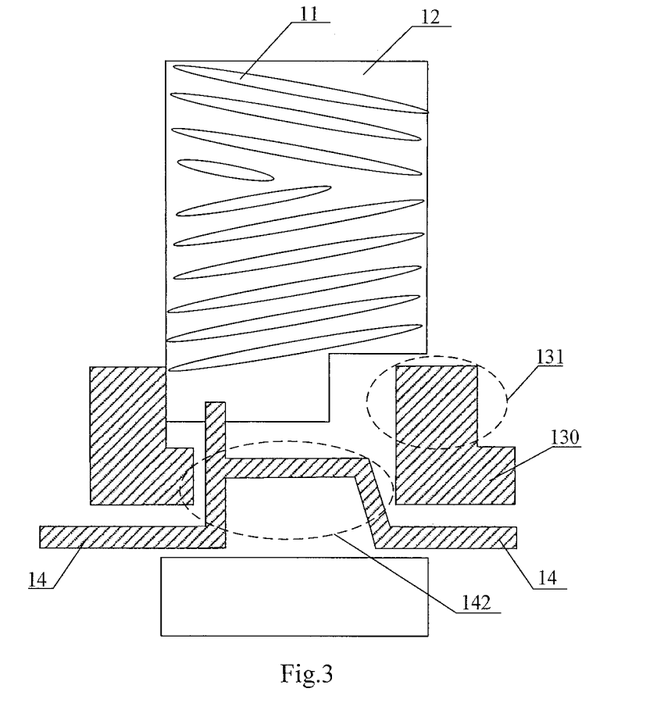
FIG. 3 is a schematic view showing the structure of a gate metal layer of an array substrate according to another embodiment of the present invention.
Figure 4:
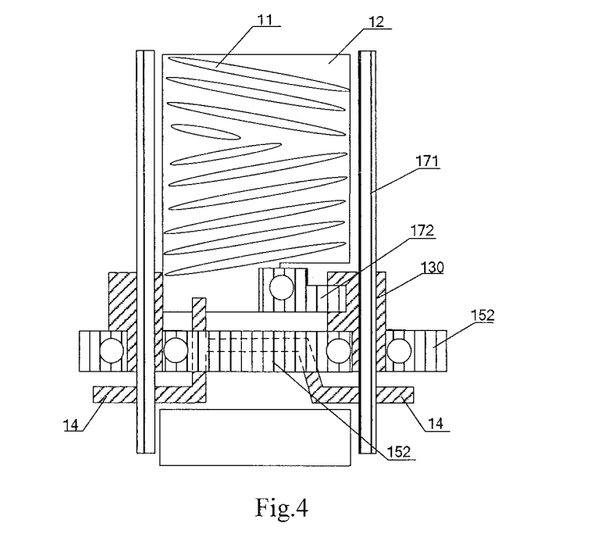
FIG. 4 is a schematic view showing the structure of an array substrate according to still another embodiment of the present invention.

As shown in FIGS. 3-4, in other embodiments of the present invention, the gap between adjacent separate segments 130 may be enlarged and the common electrode line 14 may be bent to form a bending segment 142, for example, as shown in FIG. 3 (only showing the common electrode 12 and the gate metal layer), the bending segment of the common electrode line 14 is provided in the gap between adjacent separate segments 130. To be more specific, in FIGS. 3-4, a portion of the common electrode line 14 is bent upwards into the gap between two adjacent separate segments 130, a branch is led out from the bending segment 142 to connect with the common electrode 12, and another branch is located at a position covered by the bridge 152, such that the area occupied by a metal trace is reduced, and the aperture rate is increased.

It is appreciated that the bridge for connecting the separate segments 130 so as to form the gate line may be formed by any conductive film layer known by those skilled in the art, or additional conductive film layer newly provided specially for forming the bridge. For example, the bridge in the embodiments of the present invention may be arranged in the same layer as the source/drain electrodes of the thin film transistor or as the pixel electrode or the common electrode on the substrate. When the bridge is arranged in the same layer as the pixel electrode or the common electrode, the bridge is made of transparent conductive material. In the embodiments of the present invention, the film layer and the manner for forming the bridge are not specifically defined.

In order that those skilled in the art may have a good understanding of the structure of the array substrate of the present invention, the array substrate according to other exemplary embodiments of the present invention will be described in detail next.

In the embodiment shown in FIG. 4, the array substrate is provided thereon with a pixel electrode 11, a common electrode 12, a thin film transistor, a gate line, a common electrode line 14 and a data line 171, wherein the gate line and the data line 171 intersect to form a pixel region, the pixel electrode 11 and the common electrode 12 are provided in the pixel region, and the thin film transistor is provided at a cross position of the gate line and the data line 171.

The gate line comprises a plurality of separate segments 130 which are spaced apart from each other, as shown in FIG. 3. The gate line is formed by the gate metal layer, and the separate segments 130 are connected with each other by the bridge 152 to form a continuous gate line. As shown in FIG. 4, the bridge 152 is arranged in the same layer as the source/drain electrodes 172 of the thin film transistor. The common electrode line 14 and the gate line are arranged in parallel, and a portion of the common electrode line 14 is bent upwards to form a bending segment 142, wherein the bending segment 142 is connected to the connection segment 144 which is connected directly to the common electrode 12, and at least a portion of the bending segment 142 is located at a position covered by the bridge 152.

Figure 5:
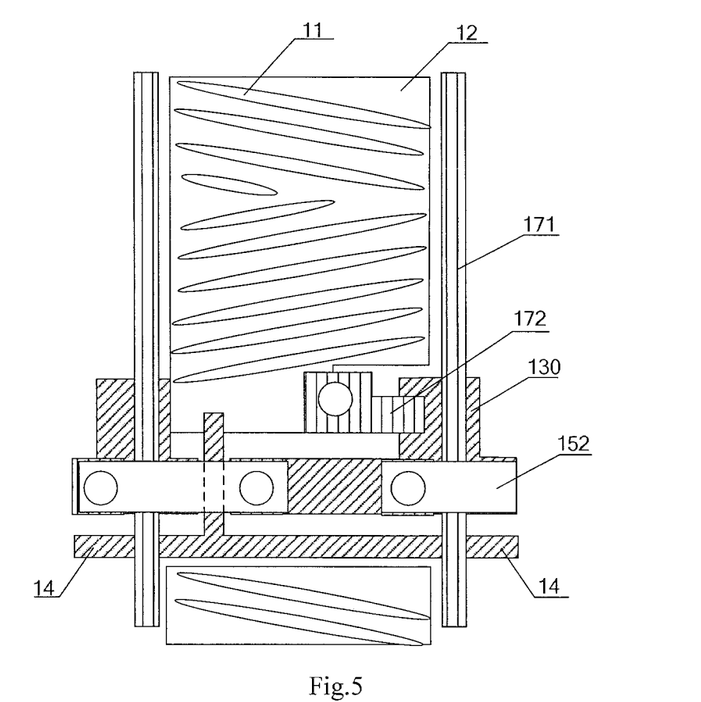
FIG. 5 is a schematic view showing the structure of an array substrate according to a further embodiment of the present invention.

In the embodiment shown in FIG. 5, the gate comprises a plurality of separate segments 130 (referring to FIG. 2)

which are spaced apart from each other and which are connected with each other by means of a bridge 152, wherein the bridge 152 and the pixel electrode 11 are arranged in the same layer. The common electrode line 14 and the gate line are arranged in parallel, and the connection segment 144 of the common electrode line 14 extends through a gap between the separate segments 130 under the bridge 152 so as to connect directly with the common electrode 12.

The separate segments 130 are connected with each other by means of the bridge 152 to form a continuous gate line. In order to reduce the resistance of the gate line (mainly to reduce the gate line resistance increased due to ITO bridge) and to avoid gate-signal delay, a parallel-connection line 153 is provided above some or all separate segments 130, with an insulation layer being provided therebetween. In the embodiment shown in FIG. 6, the array substrate may further comprise a parallel-connection line 153 overlapped with the separate segments 130 with an insulation layer being provided therebetween, wherein two ends of the parallel-connection line 153 are electrically connected with the separate segments 130 through via holes respectively.

Figure 6:
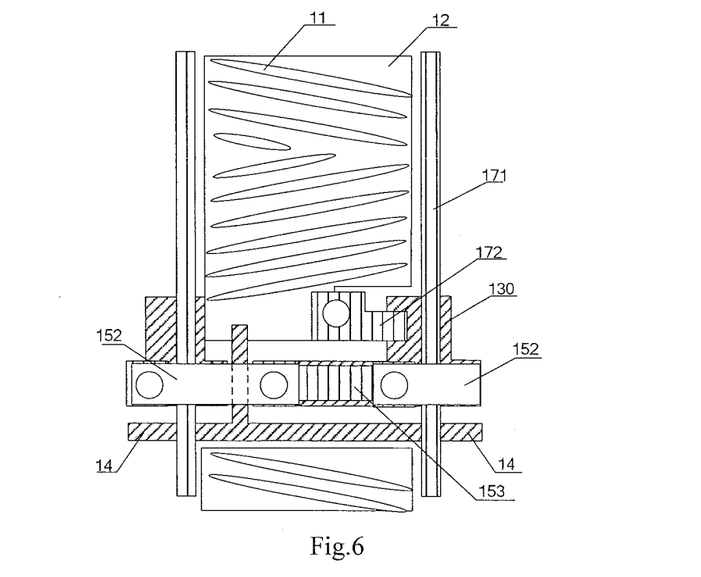
FIG. 6 is a schematic view showing the structure of an array substrate according to a still further embodiment of the present invention.

In an alternative embodiment of the present invention, both the bridge 152 and the parallel-connection line 153 are connected with the separate segments 130 as mentioned above respectively through different via holes, or through common via holes. In an alternative embodiment of the present invention, as shown in FIG. 6, each separate segment 130 is provided therein with two via holes, while the bridge 152, the parallel-connection line 153 and the separate segment 130 are electrically connected at the via holes.

In the embodiments of the present invention, the gate line is provided to comprise a plurality of separate segments which are spaced apart from each other, and the connection segment 144 of the common electrode line 14 extends through the gap between the separate segments 130 to directly connect with the common electrode 12, thus, the gate pad and the via holes for connecting the common electrode line 14 with the common electrode 12 are omitted, the aperture rate is therefore increased, the connection resistance of the gate line is thus decreased, and the gate-signal delay caused by increased connection resistance is therefore alleviated. In addition, in the case that the parallel-connection line 153 connected in parallel with the separate segments 130 is provided above the separate segments 130 with an insulation layer being provided therebetween, the gate line resistance may be reduced, which may further improve the gate-signal delay caused by increased gate line resistance.

It is noted that though the thin film transistor in the embodiments of the present invention is a bottom-gate type thin film transistor, the above description is also applicable to a top-gate type thin film transistor. In the case of a top-gate type thin film transistor, those skilled in the art may choose, based on actual situations, to form the bridge by means of an upper or lower conductive layer (usually a metal layer or electrode layer).

The embodiments of the present invention also provide a display device which comprises any one of the above array substrates. The display device may increase the aperture rate, and alleviate the gate-signal delay caused by increased connection resistance, and thus obtain a higher display quality. The display device may be any product or member with a display function, such as, a liquid crystal panel, an electronic paper, a mobile phone, a panel computer, a TV, a display, a laptop, a digital photo frame, a navigator and so on.

Figure 7:
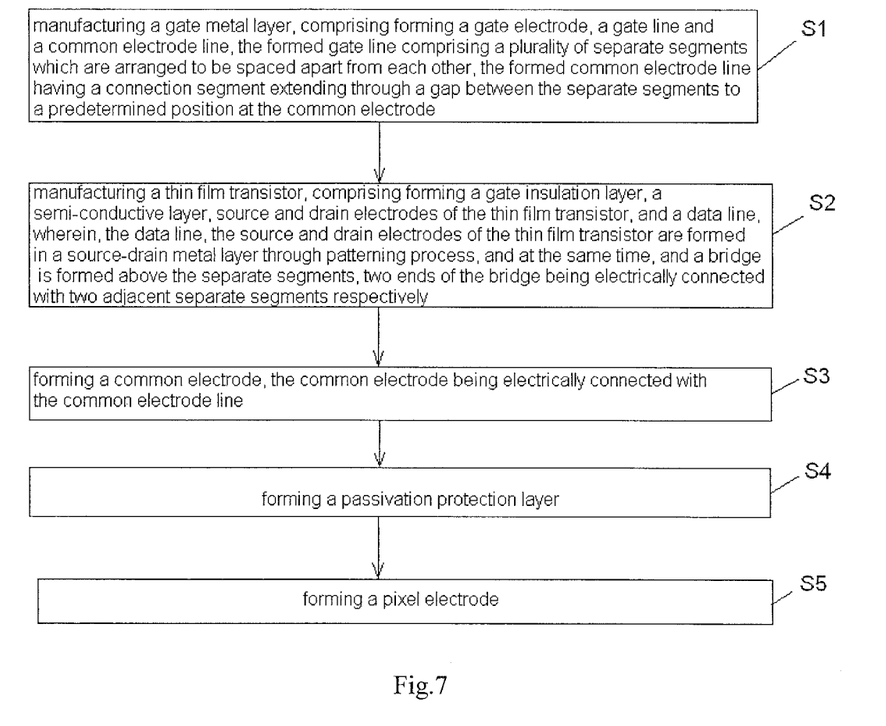
FIG. 7 is a flow chart showing a method for manufacturing an array substrate according to an embodiment of the present invention.

A method for manufacturing the array substrate according to an embodiment of the present invention will be described next. As shown in FIG. 7, the method comprises steps of:

S1: manufacturing a gate metal layer, comprising forming a gate electrode, a gate line and a common electrode line, the formed gate line comprising a plurality of separate segments which are arranged to be spaced apart from each other, the formed common electrode line having a connection segment extending through a gap between the separate segments to a predetermined position at the common electrode;

S2: manufacturing a thin film transistor, comprising forming a gate insulation layer, a semi-conductive layer, source and drain electrodes of the thin film transistor, and a data line, wherein, the data line, the source and drain electrodes of the thin film transistor are formed in a source-drain metal layer through patterning process, and at the same time, and a bridge is formed above the separate segments, two ends of the bridge being electrically connected with two adjacent separate segments respectively;

S3: forming a common electrode, the common electrode being electrically connected with the connection segment of the common electrode line;

S4: forming a passivation protection layer; and

S5: forming a pixel electrode.

In the above method, the gate line formed in step S1 comprises a plurality of separate segments which are spaced apart from each other, and the formed common electrode line has a connection segment extending through a gap between two adjacent separate segments to a predetermined position at the common electrode; in step S2, the data line, the source and drain electrodes of the thin film transistor are formed in a source-drain metal layer through patterning process, and at the same time, and a bridge is formed above the separate segments, two ends of the bridge being electrically connected with two adjacent separate segments respectively. Except the above, other steps of the method are similar to those in the prior art and will not be described herein.

Alternatively, in step S5, a transparent conductive film is formed; and then the pixel electrode is formed through patterning process, and at the same time, the bridge is formed above the separate segments. Or alternatively, the common electrode line formed in step S1 is bent to form a bending segment located in the gap between separate segments to further increase the aperture rate.

With the method for manufacturing an array substrate according to the embodiment of the present invention, the gate pad and the via holes for connecting the common electrode line with the common electrode are omitted, thus the aperture rate is increased, the connection resistance of the gate line is reduced, and therefore the gate-signal delay caused by increased connection resistance is alleviated.

In the method for manufacturing the array substrate according to the embodiment of the present invention, when the gate line is formed by the gate metal layer, the plurality of separate segments which are spaced apart from each other are formed, and the connection segment of the common electrode line extends through the gap between separate segments to a predetermined position at the common electrode; and later, when the pixel electrode or the source/drain electrodes of the transistor are formed, the bridge is formed at the same time to connect the separate segments to form a continuous gate line. Thus, compared to the technique mentioned in the Background, the gate pad and the via holes for connecting the common electrode line with the common electrode are omitted, and the aperture rate is increased, and the gate-signal delay caused by increased connection resistance is alleviated.

Thus, the present invention provides a method for manufacturing an array substrate, the method comprising steps of:

S1: manufacturing a gate metal layer, comprising forming a gate electrode, a gate line and a common electrode line, the formed gate line comprising a plurality of separate segments which are arranged to be spaced apart from each other, the formed common electrode line having a connection segment extending through a gap between the separate segments to a predetermined position;

S2: manufacturing a thin film transistor, comprising forming a gate insulation layer, a semi-conductive layer, source and drain electrodes, and a data line;

S3: forming a common electrode which is electrically connected with the common electrode line via the connection segment extending through the gap;

S4: forming a passivation protection layer;

S5: forming pixel electrodes, wherein the method further comprises forming a bridge, two ends of the bridge are electrically connected with two adjacent separate segments respectively.

The present invention also relates to a method for manufacturing an array substrate, comprising steps of: forming a plurality of separate segments which are components of a gate line, the plurality of separate segments are spaced apart from each other; forming a common electrode line having a connection segment extending through a gap between the separate segments to a predetermined position; forming a bridge, two ends of the bridge are electrically connected with two adjacent separate segments respectively; and forming a common electrode which is electrically connected with the common electrode line by the connection segment extending through the gap. Alternatively, the above method further comprises step of forming a parallel-connection line above the separate segments with an insulating layer being provided therebetween, wherein two ends of the parallel-connection line are electrically connected with adjacent separate segments respectively.

In the solutions according to the embodiments of the present invention, the gate line is configured to have a plurality of separate segments which are spaced apart from each other and which are connected with each other by means of a bridge, wherein the common electrode line comprises a connection segment which extends through a gap between the separate segments to be electrically connected with the common electrode directly. Thus, the common electrode line is electrically connected with the common electrode by means of the connection segment, and compared to the prior art mentioned in the Background, the gate pad and the via holes for connecting the common electrode line with the common electrode are omitted, therefore, the aperture rate is increased, and gate signal delay of the gate line caused by increased connection resistance is alleviated.

The embodiments of the disclosure are described in a progressive manner, and same or similar portions of the embodiments may provide reference to one another, each embodiment emphasizes the difference from other embodiments. In addition, the description of the embodiments regarding method is relatively simple because the embodiments regarding method are substantially similar to the embodiments regarding array substrate, and the related portions in the embodiments regarding array substrate may provide reference to the corresponding portion of the embodiments regarding method.

The above is only for illustrating the specific embodiments of the present invention, and the scopes of the present invention are not limited to this. Various changes or modifications which are made by those skilled in the art within the technical disclosure of the present invention all fall within the scopes of the present invention. The scopes of the present invention are defined in the claims and their equivalents.

What is claimed is:

1. An array substrate comprising:
    a thin film transistor;
    a substrate;
    a common electrode provided on the substrate;
    a gate line comprising a plurality of separate segments which are arranged to be spaced apart from each other and are connected with each other through a bridge; and
    a common electrode line provided to be spaced apart from the gate line, the gate line and the common electrode line being in the same layer,
    wherein the common electrode line comprises a connection segment extending through a gap between separate segments to electrically connect with the common electrode directly.

2. The array substrate of claim 1, wherein
    the common electrode line comprises a bending segment, the bending segment being bent into the gap and electrically connected with the connection segment.

3. The array substrate of claim 2, wherein
    the bridge is arranged in the same layer as source and drain electrodes of the thin film transistor; and
    at least a portion of the bending segment is located at a position covered by the bridge.

4. The array substrate of claim 1, wherein
    the bridge is arranged in the same layer as source and drain electrodes of the thin film transistor.

5. The array substrate of claim 1, wherein
    the bridge is made of transparent conductive material, and is arranged in the same layer as the common electrode.

6. The array substrate of claim 1, wherein
    the array substrate further comprises a pixel electrode, the bridge is made of transparent conductive material, and is arranged in the same layer as the pixel electrode.

7. The array substrate of claim 1, wherein
    the array substrate further comprises a parallel-connection line overlapped with the separate segments with an insulation layer being provided therebetween, wherein two ends of the parallel-connection line are electrically connected with adjacent separate segments respectively.

8. The array substrate of claim 7, wherein
    the parallel-connection line is arranged in the same layer as source and drain electrodes of the thin film transistor.

9. The array substrate of claim 7, wherein
    two opposite ends of two separate segments which are connected with the bridge are provided respectively with via holes through which both the parallel-connection line and the bridge are electrically connected with the two separate segments.

10. A display device comprising the array substrate of claim 1.

11. A method for manufacturing an array substrate, comprising steps of:
    S1: manufacturing a gate metal layer, comprising forming a gate electrode, a gate line and a common electrode line, the formed gate line comprising a plurality of separate segments which are arranged to be spaced apart from each other, the formed common electrode line having a connection segment extending through a gap between the separate segments to a predetermined position;

S2: manufacturing a thin film transistor, comprising forming a gate insulation layer, a semi-conductive layer, source and drain electrodes, and a data line;

S3: forming a common electrode which is electrically connected with the common electrode line via the connection segment extending through the gap;

S4: forming a passivation protection layer;

S5: forming pixel electrodes, wherein the method further comprises forming a bridge, and two ends of the bridge are electrically connected with two adjacent separate segments respectively.

12. The method of claim 11, wherein
in step S2, the source and drain electrodes of the thin film transistor, the data line are formed in a source-drain metal layer through patterning process, and at the same time, the bridge is formed above the separate segments.

13. The method of claim 11, wherein
in step S5, a transparent conductive film is formed; and then the pixel electrodes are formed through patterning process, and at the same time, the bridge is formed above the separate segments.

14. The method of claim 11, wherein
two ends of the bridge are electrically connected respectively with two adjacent separate segments through via holes.

15. The method of claim 13, wherein
in step S2, in a source-drain metal layer, the source and drain electrodes of the thin film transistors and the data line are formed through patterning process, and at the same time, a parallel-connection line is formed above the separate segments, and two ends of the parallel-connection line are connected with two adjacent separate segments respectively through via holes.

16. A method for manufacturing an array substrate, comprising steps of:
forming a plurality of separate segments which are components of a gate line, the plurality of separate segments are spaced apart from each other;
forming a common electrode line having a connection segment extending through a gap between the separate segments to a predetermined position;
forming a bridge, two ends of the bridge are electrically connected with two adjacent separate segments respectively; and
forming a common electrode electrically connected with the common electrode line by the connection segment extending through the gap.

17. The method of claim 16, further comprising step of:
forming a parallel-connection line above the separate segments, with an insulating layer being provided therebetween, wherein two ends of the parallel-connection line are electrically connected with adjacent separate segments respectively.

18. The display device of claim 10, wherein
the common electrode line comprises a bending segment, the bending segment being bent into the gap and electrically connected with the connection segment.

19. The display device of claim 10, wherein
the bridge is arranged in the same layer as source and drain electrodes of the thin film transistor.

20. The display device of claim 10, wherein
the array substrate further comprises a parallel-connection line overlapped with the separate segments with an insulation layer being provided therebetween, wherein two ends of the parallel-connection line are electrically connected with adjacent separate segments respectively.

* * * * *